United States Patent
Li et al.

(10) Patent No.: US 11,445,618 B2
(45) Date of Patent: Sep. 13, 2022

(54) FLEXIBLE CIRCUIT BOARD AND METHOD FOR MANUFACTURING SAME

(71) Applicants: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

(72) Inventors: Yao-Cai Li, Shenzhen (CN); Biao Li, Shenzhen (CN); Hao-Wen Zhong, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN); GARUDA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 17/114,981

(22) Filed: Dec. 8, 2020

(65) Prior Publication Data
US 2022/0167507 A1    May 26, 2022

(30) Foreign Application Priority Data
Nov. 25, 2020 (CN) .......................... 202011346515.9

(51) Int. Cl.
*H05K 1/00* (2006.01)
*H05K 1/02* (2006.01)
(Continued)

(52) U.S. Cl.
CPC ........... *H05K 3/4635* (2013.01); *H05K 1/118* (2013.01); *H05K 3/28* (2013.01); *H05K 3/462* (2013.01);
(Continued)

(58) Field of Classification Search
CPC .......... H05K 1/00; H05K 1/02; H05K 1/0219; H05K 1/024; H05K 1/028; H05K 1/0289;
(Continued)

(56) References Cited

U.S. PATENT DOCUMENTS 11,197,368 B1 * 12/2021 Shen .................... H05K 1/0219
2011/0005811 A1 * 1/2011 Yamato ................ H05K 3/4691
174/254

(Continued)

FOREIGN PATENT DOCUMENTS

CN         111295041 A    6/2020

*Primary Examiner* — Xiaoliang Chen
(74) *Attorney, Agent, or Firm* — ScienBiziP, P.C.

(57) ABSTRACT

A method for manufacturing a flexible circuit board includes providing a first laminated structure, the first laminated structure including two first wiring boards, a first adhesive layer sandwiched between the two first wiring boards, and a first conductive structure. The first conductive structure penetrates the two first wiring boards and the first adhesive layer and electrically connects the two first wiring boards. The first adhesive layer defines a first opening, the first opening includes a first edge away from the first conductive structure. The first laminated structure is cut along the first edge and then the two first wiring boards are unfolded. A flexible circuit board manufactured by such method is also disclosed.

6 Claims, 10 Drawing Sheets

(51) Int. Cl.
*H05K 3/06* (2006.01)
*H05K 3/22* (2006.01)
*H05K 3/28* (2006.01)
*H05K 3/36* (2006.01)
*H05K 3/40* (2006.01)
*H05K 3/46* (2006.01)
*H05K 1/11* (2006.01)

(52) U.S. Cl.
CPC ............... *H05K 2201/0338* (2013.01); *H05K 2203/1377* (2013.01)

(58) Field of Classification Search
CPC . H05K 1/118; H05K 3/06; H05K 3/22; H05K 3/28; H05K 3/36; H05K 3/40; H05K 3/46; H05K 3/281; H05K 3/462; H05K 3/4602; H05K 3/4611; H05K 3/4635; H05K 3/4652; H05K 3/4655; H05K 3/4691; H05K 3/4697
USPC ............... 174/254; 361/290, 301.1; 200/600; 29/830
See application file for complete search history.

(56) References Cited

U.S. PATENT DOCUMENTS

| | | | |
|---|---|---|---|
| 2012/0228109 A1* | 9/2012 | Wang | H01G 5/16 |
| | | | 200/600 |
| 2020/0154559 A1* | 5/2020 | Hou | H05K 3/4691 |
| 2021/0161019 A1* | 5/2021 | Yamazaki | H05K 3/4611 |

* cited by examiner

FLEXIBLE CIRCUIT BOARD AND METHOD FOR MANUFACTURING SAME

FIELD

The subject matter herein generally relates to printed circuits, especially to a flexible circuit board and a method for manufacturing the same.

BACKGROUND

Circuit boards are currently limited in length, a maximum length being about 620 mm. A circuit board with a length longer than 620 mm can be made by soldering a plurality of circuit boards together, but a circuit board made in this way will be of reduced quality due to inherent weaknesses in soldered joints and possibly poor soldering.

BRIEF DESCRIPTION OF THE DRAWINGS

Implementations of the present technology will now be described, by way of embodiment, with reference to the attached figures.

DETAILED DESCRIPTION

Figure 1:
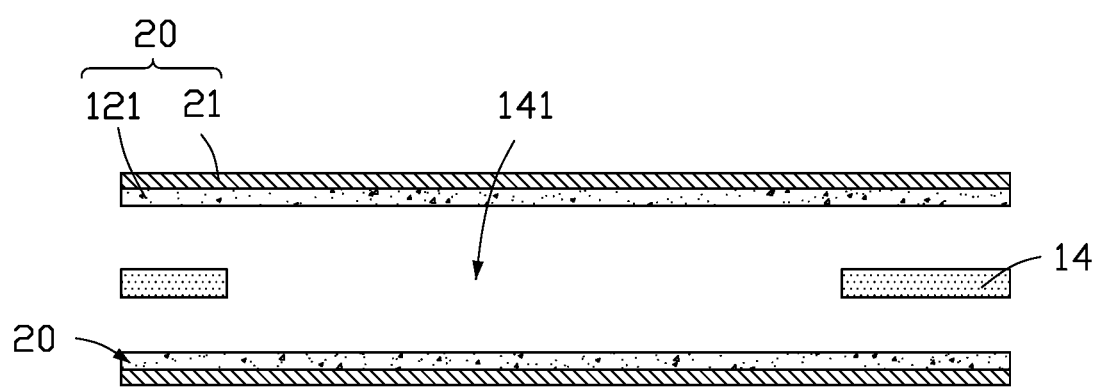
FIG. 1 is a cross-sectional view of two copper clad laminates and a first adhesive layer, in accordance with an embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein.

The term "comprising," when utilized, means "including, but not necessarily limited to"; it specifically indicates open-ended inclusion or membership in the so-described combination, group, series, and the like. When a first component is referred to as "connecting" to a second component, it is intended that the first component may be directly connected to the second component or may be indirectly connected to the second component via a third component between them.

A method for manufacturing a flexible circuit board in one embodiment includes the following steps S1 to S4.

Figure 4:
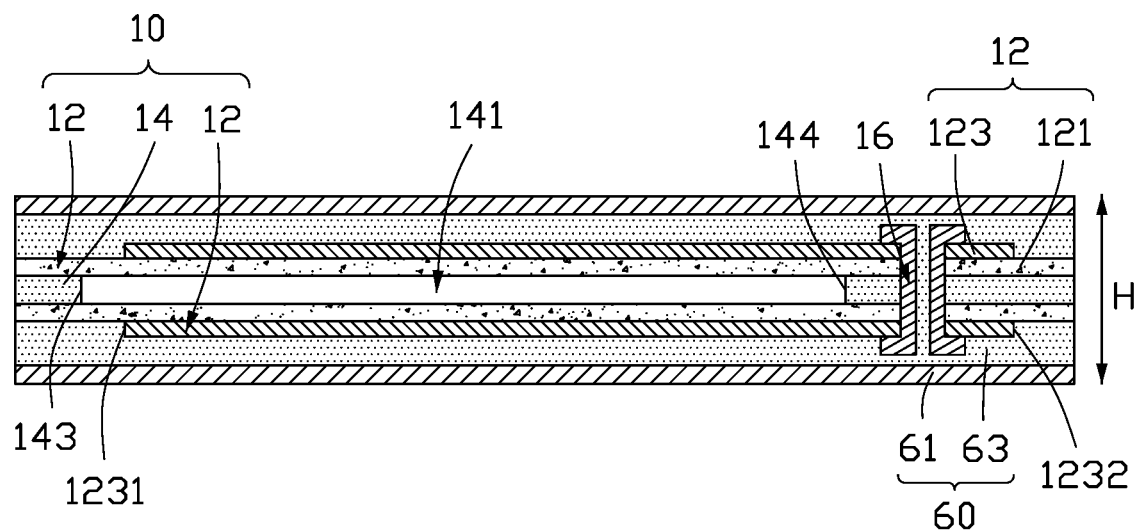
FIG. 4 is a cross-sectional view showing two first cover films pressed onto both sides of the structure shown in FIG. 3.

Referring to FIG. 4, at step S1, a first laminated structure 10 is provided. The first laminated structure 10 includes two first wiring boards 12, a first adhesive layer 14, and a first conductive structure 16. The first adhesive layer 14 is sandwiched between the first wiring boards 12. The first conductive structure 16 penetrates the first wiring boards 12 and the first adhesive layer 14, and electrically connects the first wiring boards 12.

Each of the first wiring boards 12 includes a first insulation layer 121 and a first conductor layer 123 laminated on the first insulation layer 121. A material of the first insulation layer 121 may be, but is not limited to, polyimide, polyethylene terephthalate, or polyethylene naphthalate. The material of the first conductor layer 123 may be, but is not limited to, a metal, such as copper, silver, or alloys thereof. In the embodiment, the material of the first insulation layer 121 is polyimide, and the material of the first conductor layer 123 is copper.

The first insulation layer 121 is overlapped with and attached to the first adhesive layer 14. The first adhesive layer 14 defines a first opening 141. Portions of the first wiring boards 12 are exposed in the first opening 141. The first opening 141 includes a first edge 143 away from the first conductive structure 16 and a third edge 144 adjacent to the first conductive structure 16.

The first conductive structure 16 electrically connects the first conductor layers 123 of the first wiring boards 12. The first conductor layer 123 includes a first end 1231 away from the first conductive structure 16 and a second end 1232 adjacent to the first conductive structure 16. Along a thickness direction H of the flexible circuit board, a projection of the first end 1231 falls in a projection of the first opening 141.

According to one embodiment, the step S1 includes the following steps.

Figure 2:
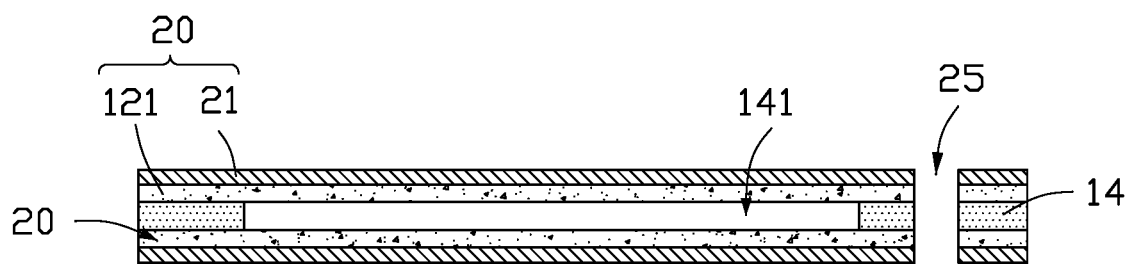
FIG. 2 is a cross-sectional view showing the two copper clad laminates and the first adhesive layer shown in FIG. 1 pressed together.

Referring to FIGS. 1 and 2, two first copper clad laminates 20 and the first adhesive layer 14 with the first opening 141 are provided, and the two first copper clad laminates 20 are pressed onto opposite sides of the first adhesive layer 14. Each of the first copper clad laminates 20 includes the first insulation layer 121 and a first copper layer 21 laminated on the first insulation layer 121.

Referring to FIG. 2, a first through hole 25 penetrating the first copper clad laminates 20 and the first adhesive layer 14 is defined. The first through hole 25 does not communicate with the first opening 141.

Figure 3:
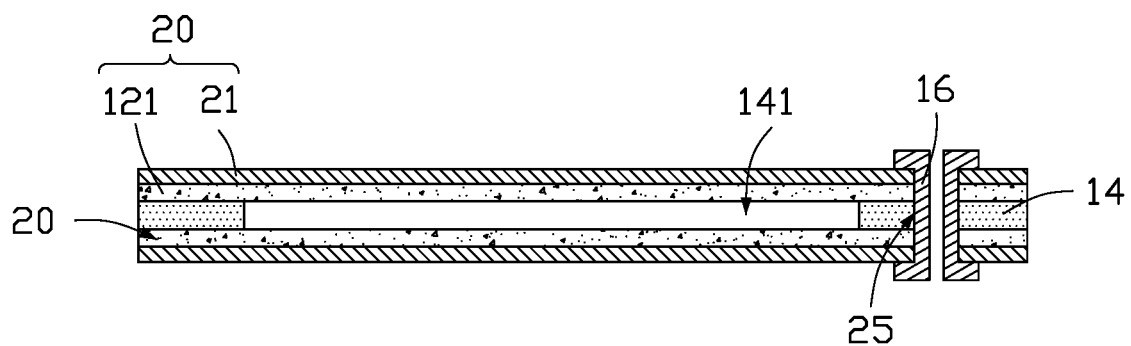
FIG. 3 is a cross-sectional view showing a first conductive structure formed on one end of the structure shown in FIG. 2.

Referring to FIG. 3, the first through hole 25 is electroplated to form the first conductive structure 16 in the first through hole 25. In the embodiment, the first conductive structure 16 is a conductive via.

Referring to FIG. 4, each of the first copper layers is etched to form the first conductor layer 123, thereby obtaining the first laminated structure 10.

The flexible circuit board further includes two first cover films 60. The first cover films 60 are pressed onto opposite sides of the first laminated structure 10 and cover the first conductor layers 123 of the first wiring boards 12. The first cover films 60 protect the first conductor layers 23. The two first cover films 60 cover opposite ends of the first conductive structure 16. Each of the first cover films 60 includes a first protective layer 61 and a first adhesive 63 coated on one side of the first protective layer 61, and the first adhesive 63 infills the conductive via of the first laminated structure 10.

Figure 8:
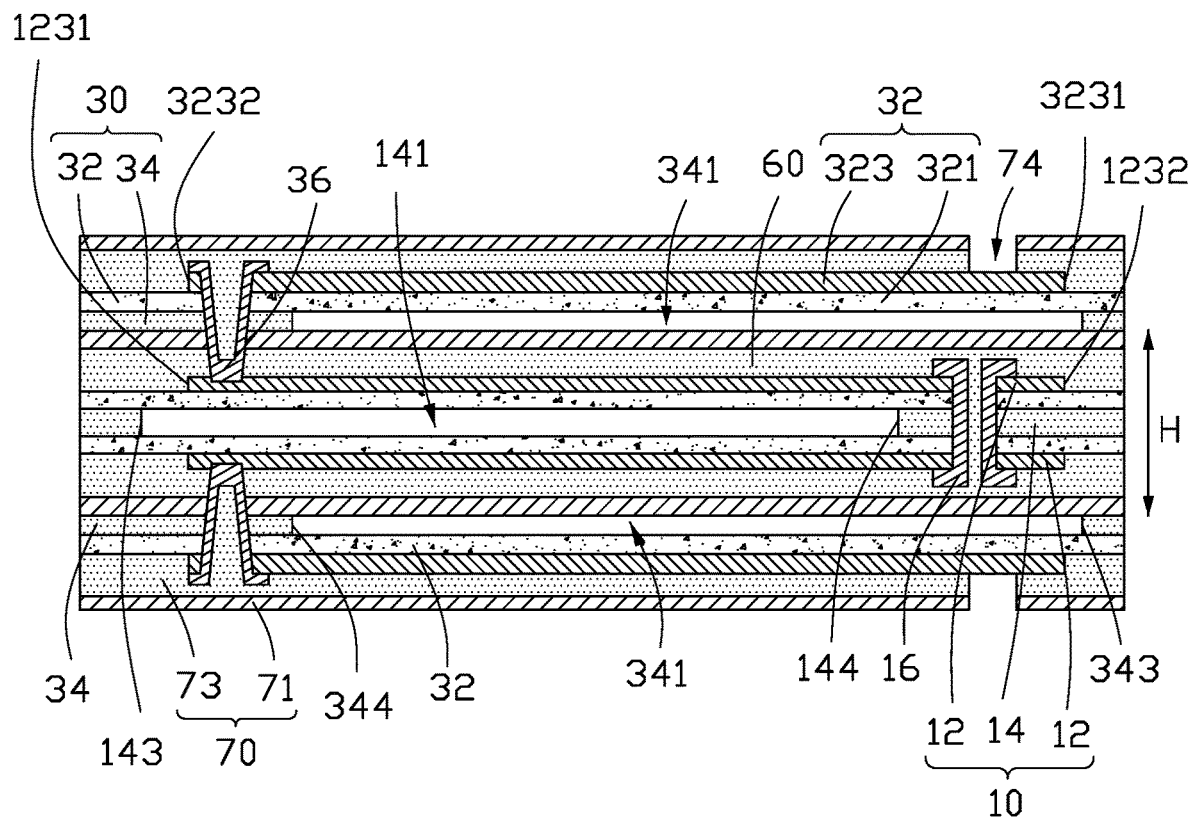
FIG. 8 is a cross-sectional view showing second cover films pressed onto both sides of the structure shown in FIG. 7.

Referring to FIG. 8, at step S2, two second laminated structures 30 are formed on opposite sides of the first laminated structure 10. Each of the second laminated structures 30 includes a second wiring board 32, a second adhesive layer 34 stacked on a side of the second wiring board 32, and a second conductive structure 36. The second wiring board 32 is bonded to one first cover film 60 through the second adhesive layer 34. The second conductive structure 36 penetrates the second wiring board 32, the second adhesive layer 34, and one first cover film 60, and electrically connects the second wiring board 32 and one first wiring board 12.

The second wiring board 32 includes a second insulation layer 321 and a second conductor layer 323 stacked on the second insulation layer 321. The material of the second insulation layer 321 may be, but is not limited to, polyimide, polyethylene terephthalate, or polyethylene naphthalate. The material of the second conductor layer 323 may be, but is not limited to, a metal, such as copper, silver, or alloys thereof. In the embodiment, the material of the second insulation layer 321 is polyimide, and the material of the second conductor layer 323 is copper.

The second insulation layer 321 is overlapped with and attached to the second adhesive layer 34. The second adhesive layer 34 defines a second opening 341. A portion of the second wiring board 32 is exposed in the second opening 341. The second opening 341 includes a second edge 343 away from the second conductive structure 36 and a fourth edge 344 adjacent to the second conductive structure 36. The first conductive structure 16 corresponds in position to the second opening 341.

The second conductive structure 36 corresponds in position to the first opening 141. The second conductive structure 36 electrically connects the second conductor layer 323 and one first conductor layer 123. The second conductor layer 323 includes a third end 3231 away from the second conductive structure 36 and a fourth end 3232 adjacent to the second conductive structure 36. Along the thickness direction H of the flexible circuit board, the projections of the third end 3231 and of the second end 1232 fall in a projection of the second opening 341. Along the thickness direction H of the flexible circuit board, a projection of the fourth end 3232 falls in the projection of the first opening 141.

According to one embodiment, the step S2 includes the following steps.

Figure 5:
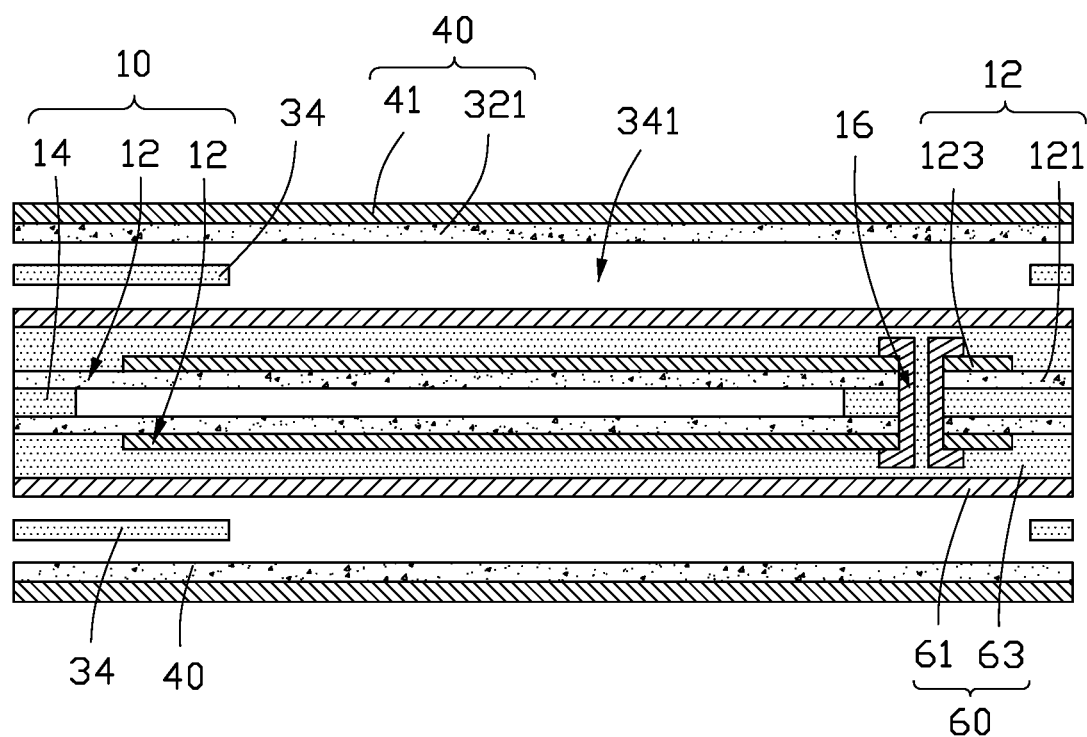
FIG. 5 is a cross-sectional view showing second copper clad laminates and second adhesive layers provided on both sides of the structure shown in FIG. 4.
Figure 6:
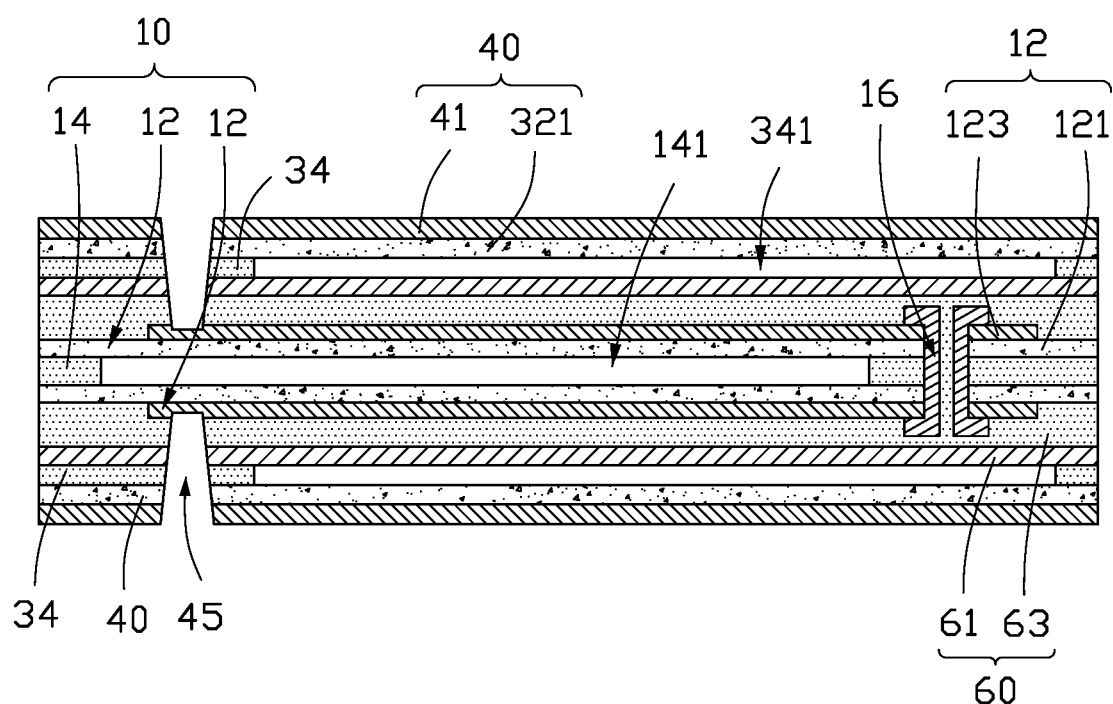
FIG. 6 is a cross-sectional view showing the structures of FIG. 5 pressed together and pierced to a certain depth.

Referring to FIGS. 5 and 6, two second copper clad laminates 40 and two second adhesive layer 34 with second openings 341 are provided. One second adhesive layer 34 and one second copper clad laminate 40 are pressed in said order onto one side of the first laminated structure 10, and another second adhesive layer 34 and another second copper clad laminate 40 are pressed in said order onto the other side of the first laminated structure 10. Each of the second copper clad laminates 40 includes the second insulation layer 321 and a second copper layer 41 laminated on the second insulation layer 321.

Referring to FIG. 6, a second through hole 45 penetrating one second copper clad laminate 40, one second adhesive layer 34, and one first cover film 60 is defined. A portion of one second conductor layer 323 is exposed from the second through hole 45. The second through hole 45 corresponds in position to the first opening 141, and the second through hole 45 does not communicate with the second opening 341.

Figure 7:
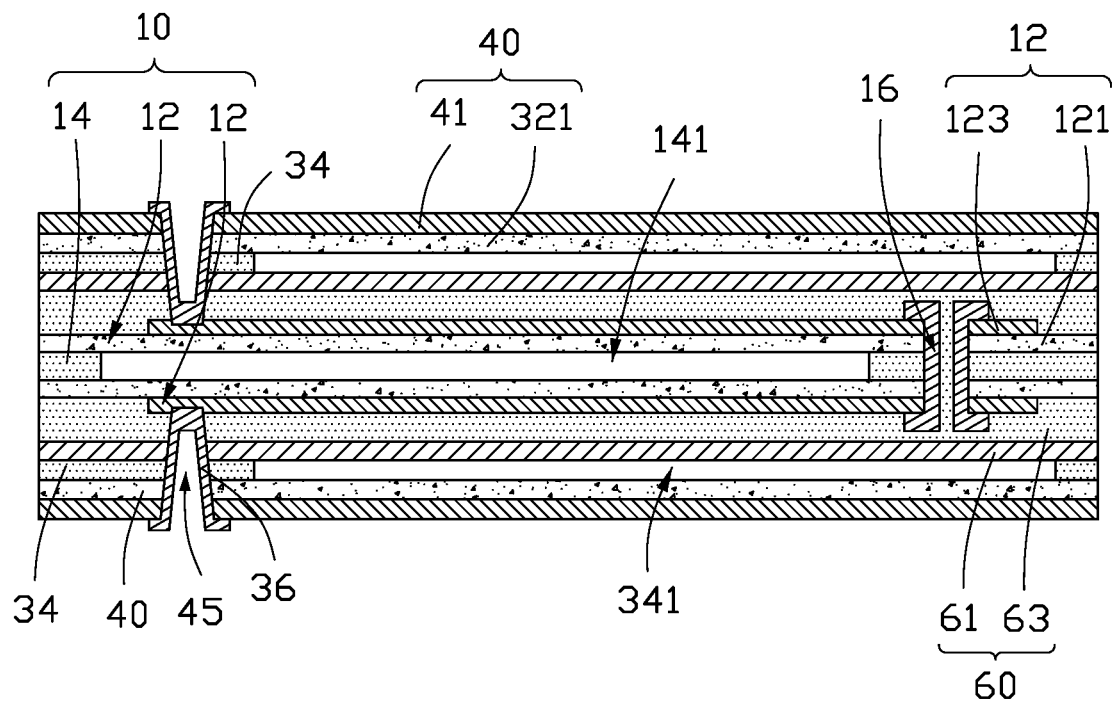
FIG. 7 is a cross-sectional view showing a second conductive structure formed on the structure shown in FIG. 6.

Referring to FIG. 7, the second through hole 45 is electroplated to form the second conductive structure 36 in the second through hole 45. In the embodiment, the second conductive structure 36 is a conductive via.

Referring to FIG. 8, each of the second copper layers of the second copper clad laminates is etched to form the second conductor layer 323, thereby obtaining two second laminated structures 30 formed on opposite sides of the first laminated structure 10.

The flexible circuit board further includes two second cover films 70. The second cover films 70 are pressed onto two sides of the two second laminated structures 30 away from the first laminated structure 10 and cover two second conductor layers 323 of the two second wiring boards 32. The second cover films 70 protect the second conductor layers 323. Each of the second cover films 70 covers an end of one second conductive structure 36 away from the first wiring board 12. Each of the second cover films 70 defines a mask opening 74, and a portion of one second conductor layer 323 is exposed from the mask opening 74. Each of the second cover films 70 includes a second protective layer 71 and a second adhesive 73 coated on a side of the second protective layer 71. The second adhesive 73 infills the conductive via of each of the second laminated structures 30.

Figure 9:
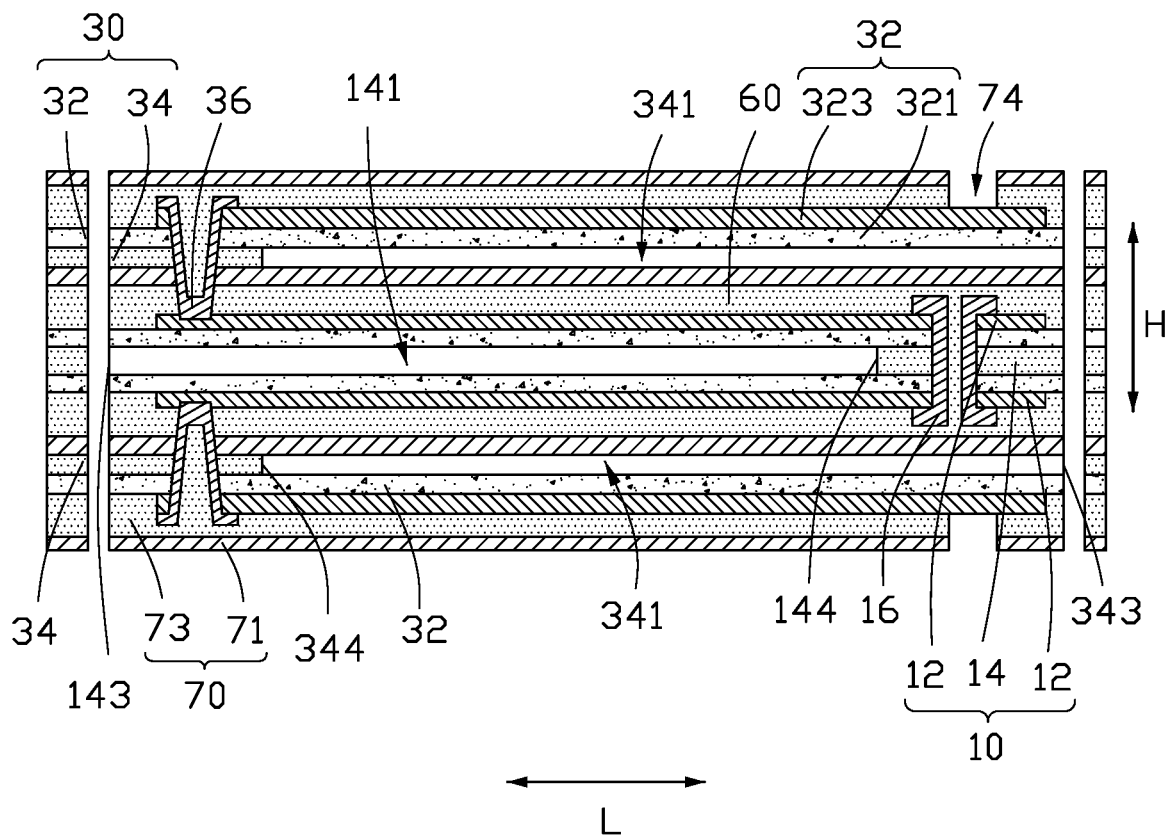
FIG. 9 is a cross-sectional view of the structure shown in FIG. 0.8 after cutting.
Figure 10:
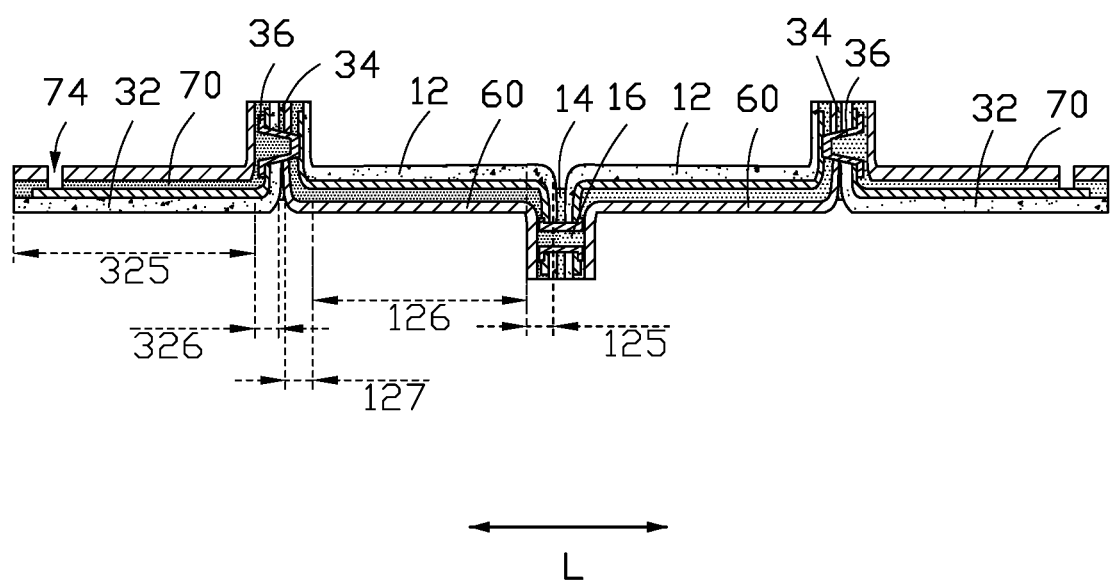
FIG. 10 is a cross-sectional view of a flexible circuit board when the structure shown in FIG. 9 is unfolded.

Referring to FIGS. 9 and 10, at step S3, the first laminated structure 10 and the two second laminated structures 30 are cut along the first edge 143 and the second edge 343, and the two first wiring boards 12 and the two second wiring boards 32 are unfolded to obtain the flexible circuit board 100. In the embodiment, after being unfolded, the two first wiring boards 12 and the two second wiring boards 32 are arranged in a straight line in a length direction L of the flexible circuit board 100.

After being unfolded, each of the first wiring boards 12 includes a first bent portion 125, a first flat portion 126, and a second bent portion 127. The first bent portion 125 and the second bent portion 127 are at an approximate right angle relative to the first flat portion 126. In the embodiment, the first bent portion 125 and the second bent portion 127 extend in opposite directions from the ends of the first flat portion 126. Two first bent portions 125 of the two first wiring boards 12 are electrically connected by the first conductive structure 16 and are bonded together by the first adhesive layer 14 sandwiched therebetween. The first conductive structure 16 penetrates the two first bent portions 125.

After being unfolded, two second wiring boards 32 are connected to both sides of the two first wiring boards 12, and each of the two second wiring boards 32 includes a second flat portion 325 and a third bent portion 326. Relative to the second flat portion 325, the third bent portion 326 is approximately at a right angle. In the embodiment, the third bent portion 326 extends from an end of the second flat portion 325. The third bent portion 326 of each of the two second wiring boards 32 is electrically connected to the second bent portion 127 of an adjacent first wiring board 12 by the second conductive structure 36. The third bent portion 326 adheres to the third bent portion 326 by the second adhesive layer 34 sandwiched therebetween. The second conductive structure 36 penetrates the adjacent second and third bent portions 127, 326.

In the method, a plurality of laminated structures are pressed together, followed by cutting along edges of the openings of the adhesive layers and unfolding, thereby increasing a length of a circuit board. In the flexible circuit board 100, the bent portions of adjacent wiring boards are electrically connected by a conductive structure which penetrates the wiring boards, so that the adjacent wiring boards are robustly connected in addition to being electrically connected.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A method for manufacturing a flexible circuit board comprising:
    providing a first laminated structure, the first laminated structure comprising two first wiring boards, a first adhesive layer sandwiched between the two first wiring boards, and a first conductive structure, the first conductive structure penetrating the two first wiring boards and the first adhesive layer and electrically connecting the two first wiring boards, the first adhesive layer defining a first opening, the first opening comprising a first edge away from the first conductive structure;
    cutting the first laminated structure along the first edge;
    unfolding the two first wiring boards, thereby obtaining the flexible circuit board;
    forming two second laminated structures on opposite sides of the first laminated structure, each of the two second laminated structure comprising a second adhesive layer, a second wiring board stacked on a side of the second adhesive layer, and a second conductive structure, the second conductive structure penetrating the second wiring board and the second adhesive layer and electrically connecting the second wiring board and one of the two first wiring boards, the second conductive structure corresponding in position to the first opening, the second adhesive layer defining a second opening, the first conductive structure corresponding in position to the second opening, the second opening comprising a second edge away from the second conductive structure;
    cutting the two second laminated structures along the first edge and cutting the two second laminated structures and the first laminated structure along the second edge; and
    unfolding two wiring boards of the two second laminated structures.

2. The method of claim 1, further comprising pressing two first cover films onto opposite sides of the first laminated structure, each of the two first cover films being sandwiched between the first laminated structure and one of the two second laminated structures.

3. The method of claim 2, wherein the first conductive structure is a conductive via, each of the two first cover films comprises a first protective layer and a first adhesive coated on a side of the first protective layer, the first adhesive infilling the conductive via.

4. The method of claim 1, further comprising pressing two second cover films onto two sides of the two second laminated structures away from the first laminated structure.

5. The method of claim 1, wherein each of the two first wiring boards comprises a first insulation layer and a first conductor layer stacked on a side of the first insulation layer, the first conductor layer is electrically connected to the first conductive structure, the first conductor layer comprises a first end away from the first conductive structure and a second end adjacent to the first adjacent structure; along a thickness direction of the flexible circuit board, a projection of the first end falls in a projection of the first opening, and a projection of the second end falls in a projection of the second opening.

6. The method of claim 5, wherein the second wiring board comprises a second insulation layer and a second conductor layer stacked on a side of the second insulation layer, the second conductor layer is electrically connected to the second conductive structure, the second conductor layer comprises a third end away from the second conductive structure and a fourth end adjacent to the second conductive structure, along the thickness direction of the flexible circuit board, a projection of the third end falls in the projection of the second opening, and a projection of the fourth end falls in the projection of the first opening.

* * * * *